(12) United States Patent
Natsuhara et al.

(10) Patent No.: US 7,268,321 B2
(45) Date of Patent: Sep. 11, 2007

(54) WAFER HOLDER AND SEMICONDUCTOR MANUFACTURING APPARATUS

(75) Inventors: Masuhiro Natsuhara, Itami (JP); Hirohiko Nakata, Itami (JP); Akira Kuibira, Itami (JP); Manabu Hashikura, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 10/498,460

(22) PCT Filed: Mar. 19, 2003

(86) PCT No.: PCT/JP03/03379

§ 371 (c)(1),
(2), (4) Date: May 28, 2004

(87) PCT Pub. No.: WO2004/028208

PCT Pub. Date: Apr. 1, 2004

(65) Prior Publication Data

US 2005/0077284 A1    Apr. 14, 2005

(30) Foreign Application Priority Data

Sep. 18, 2002   (JP) .............................. 2002-270951

(51) Int. Cl.
*H05B 3/68*    (2006.01)
*C23C 16/00*   (2006.01)

(52) U.S. Cl. .................................... 219/444.1; 118/724

(58) Field of Classification Search ............. 219/444.1, 219/390; 392/416, 418; 118/723 UZ, 723 IR, 118/724, 725, 726, 727, 728, 729, 730
See application file for complete search history.

(56) References Cited

U.S. PATENT DOCUMENTS

| 5,231,690 | A   |      | 7/1993  | Sina et al. |
|-----------|-----|------|---------|-------------|
| 5,306,895 | A   |      | 4/1994  | Ushikoshi et al. |
| 5,688,331 | A   | *    | 11/1997 | Aruga et al. ................. 118/725 |
| 6,204,488 | B1  | *    | 3/2001  | Toya et al. ................. 219/541 |
| 6,376,808 | B2  | *    | 4/2002  | Tachikawa et al. ...... 219/444.1 |

FOREIGN PATENT DOCUMENTS

JP         H05-267191 A    10/1993

(Continued)

*Primary Examiner*—Sang Paik
(74) *Attorney, Agent, or Firm*—James Judge

(57) ABSTRACT

A wafer holder is provided in which local heat radiation in supporting and heating wafers is kept under control and temperature uniformity of the wafer retaining surface is enhanced, and by making use of the wafer holder a semiconductor manufacturing apparatus suitable for processing larger-diameter wafers is made available. In a wafer holder (1) including within a ceramic substrate (2) a resistive heating element (3) or the like and being furnished with a lead (4) penetrating a reaction chamber (6), the lead (4) is housed in a tubular guide member (5), and an interval between the guide member (5) and the reaction chamber (6) as well as the interior of the guide member (5) are hermetically sealed. The guide member (5) and the ceramic substrate (2) are not joined together, and in the interior of the guide member (5) in which the inside is hermetically sealed, the atmosphere toward the ceramic substrate (2) is preferably substantially the same as the atmosphere in the reaction chamber (6).

9 Claims, 7 Drawing Sheets

FOREIGN PATENT DOCUMENTS

| | | |
|---|---|---|
| JP | H06-077148 A | 3/1994 |
| JP | H06-028258 B2 | 4/1994 |
| JP | H06-124907 A | 5/1994 |
| JP | 2525974 | 5/1996 |
| JP | 2001-319758 A | 11/2001 |
| JP | 2002-299432 A | 10/2002 |

* cited by examiner

Structure A

Structure B

Structure C

Structure D

Structure E

Structure F

Structure G

Structure Z (Prior Art)

WAFER HOLDER AND SEMICONDUCTOR MANUFACTURING APPARATUS

TECHNICAL FIELD

The present invention relates to wafer holders for heating wafers on which predetermined processes are carried out in semiconductor manufacturing procedures, and to semiconductor manufacturing apparatuses furnished with the wafer holders.

BACKGROUND ART

A variety of wafer holder structures for use in semiconductor manufacturing apparatuses have been proposed to date. For example, Japanese Examined Pat. App. Pub. No. H06-28258 proposes a semiconductor wafer-heating device including: a heater part made of ceramic, in which a resistive heating element is embedded, and that is provided with a wafer-heating side and is installed within a reaction chamber; a columnar support part provided on the side of the heater part other than its wafer-heating side and that forms a hermetic seal between it and the reaction chamber, and electrodes connected to the resistive heating element and leading out to the reaction chamber exterior so as substantially not to be exposed to the reaction-chamber interior space.

In another example, Japanese Pat. Pub. No. 2525974 proposes a structure in which tubular pieces are joined to a ceramic susceptor part (wafer holder). Specifically, proposed therein is a semiconductor wafer heating device including a ceramic susceptor part, a retaining part, installed in a reaction chamber, for supporting the ceramic susceptor part, and leads connected to heater terminals. At least one of the leads is surrounded by a tubular piece made of an inorganic insulating material, and one end of the tubular piece is joined hermetically onto the ceramic susceptor, while the other end thereof is inserted through a through-hole provided in the reaction chamber, where it is sealed hermetically.

With the transition to silicon wafers of larger diametric span moving forward in recent years uniform temperature distribution over the wafer support surface is in particular demanded of wafer holders. A drawback with the apparatus set out in Japanese Examined Pat. App. Pub. No. H 6-28258, however, is that, because the ceramic susceptor, being a wafer holder, is supported by a columnar support part that is hermetically sealed between it and the reaction chamber and that is in contact with the ambient air outside the reaction chamber, the temperature uniformity of the wafer support surface is compromised due to heat radiation toward the ambient air.

Likewise, in the structure set out in the above-mentioned Japanese Pat. Pub. No. 2525974, the tubular piece that houses the lead is joined to the ceramic susceptor part and passes through the reaction chamber, where the chamber is sealed off hermetically; therefore, the interior of the tubular piece will inevitably be at the atmospheric pressure, whereas the wafer-processing atmosphere within the reaction chamber is at reduced pressure or a vacuum. The consequent problem has been that the amount of heat that dissipates through the air at atmospheric pressure within the tubular piece grows greater than that elsewhere, reducing the temperature at the joint of the ceramic susceptor part with the tubular piece and spoiling the temperature uniformity of the wafer support surface. Moreover, the fact that the tubular piece is joined to the ceramic susceptor has meant that the escape of heat from the joint portion is significant, which has meant that the temperature uniformity of the wafer support surface is further compromised as a result.

What is more, the lead for supplying power to the ceramic susceptor part is exposed to the ambient air and toward the ceramic susceptor part its temperature grows due to the heating of the ceramic susceptor part. The problem has therefore been that the portion of the lead that has become temperature-elevated is more likely to corrode due to oxygen in the air. Another problem that has persisted has been that because the tubular piece is joined to the ceramic susceptor part and the interval between it and the reaction chamber is hermetically sealed costs rise owing to the low throughput in the joining.

DISCLOSURE OF INVENTION

An object of the present invention, in view of such circumstances to date, is to make available a wafer holder in which local heat radiation in retaining and heating wafers in the reaction chamber is kept under control to enhance the temperature uniformity of the wafer retaining surface, and to make available, utilizing the wafer holder, a semiconductor manufacturing apparatus that is suitable for processing larger-diameter wafers.

In order to achieve the foregoing objective, a wafer holder that the present invention provides is a wafer holder including in a ceramic substrate at least one of a resistive heating element, a plasma-generating electrode, an electrostatic chuck electrode, and an electron-beam electrode, and furnished with a lead penetrating a reaction chamber, for connecting the one of them to an external electrode lead, characterized in that either an interval between the lead itself and the reaction chamber is hermetically sealed directly, or the lead is housed in a tubular guide member and an interval between the guide member and the reaction chamber as well as the guide member interior is hermetically plugged.

Preferable in the above-characterized wafer holder of the present invention is that within the guide member hermetically plugged along the interior the atmosphere is substantially the same as the atmosphere within the reaction chamber, or is a vacuum. Also preferable is that the guide member and the ceramic substrate not be joined.

Preferable in the foregoing wafer holder of the present invention is that the lead is joined at a hermetically plugged part in the guide member interior with glass or a brazing material. Likewise preferable in the foregoing wafer holder of the present invention is that the guide member covers either a portion of or the entirety of the lead that is arranged in the reaction chamber.

Preferable in the foregoing wafer holder of the present invention is that the principal component of said ceramic substrate is one of alumina, silicon nitride, aluminum nitride or silicon carbide. Meanwhile, preferable for the principal component of the ceramic substrate is one of alumina, silicon nitride, aluminum nitride or silicon carbide.

The present invention also provides a semiconductor manufacturing apparatus characterized in being equipped in the reaction chamber with the foregoing wafer holder. Preferable in the semiconductor manufacturing apparatus of the present invention is that the atmosphere within the reaction chamber not be a corrosive gas. The semiconductor manufacturing apparatus of the present invention is suitable for low-k film baking.

BEST MODE FOR CARRYING OUT THE INVENTION

Figure 1:
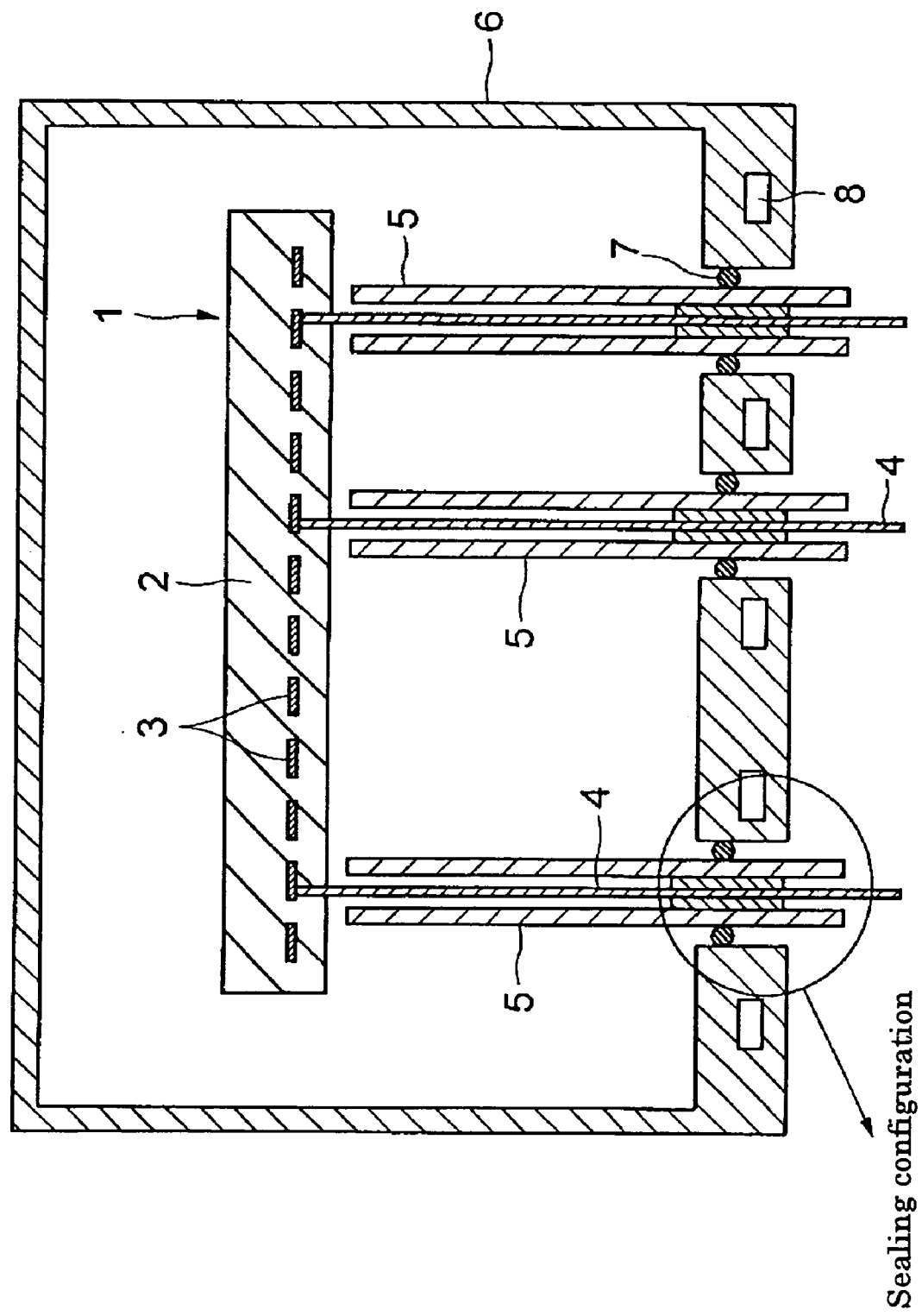
FIG. 1 is a schematic sectional view depicting a wafer holder of the present invention, along with a reaction chamber.

In accordance with the present invention, as illustrated in FIG. 1 for example, in a wafer holder 1 having a ceramic substrate 2 in which an electric circuit such as a resistive heating element 3 is embedded, leads 4 for connecting to external electrodes for supplying power to the resistive heating element 3 or the like are housed in tubular guide members 5, and the guide members 5 are installed penetrating the reaction chamber 6. One end of each guide member 5 is not joined to the ceramic substrate 2, and the other end thereof is hermetically plugged at the reaction chamber 6 by means of an O-ring 7 or the like, and at the same time a hermetic plug is also formed within the interior of the guide member 5. It should be understood that reference numeral 8 in FIG. 1 denotes a water-cooling device provided in a bottom wall of the reaction chamber 6.

Figure 12:
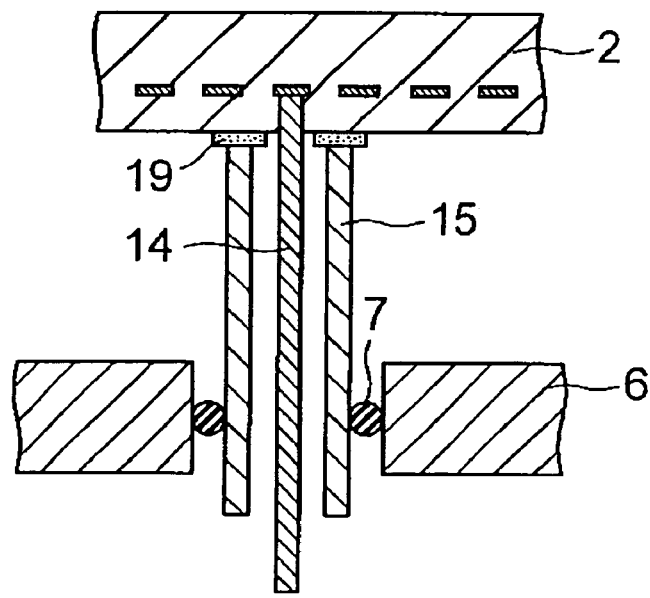
FIG. 12 is a schematic sectional view depicting a specific example of a mounting structure in a conventional wafer holder.

In contrast, as illustrated in FIG. 12, in the structure set out in the previously-mentioned Japanese Pat. Pub. No. 2525974, a tubular piece 15 that houses a lead 14 is joined gastight to the ceramic substrate 12 by means of a glass joint 19, and also sealed hermetically at the reaction chamber 6 by means of an O-ring 7. As a consequence, the interior of the tubular piece 15 is the air at atmospheric pressure, allowing heat to dissipate through the air at atmospheric pressure within the tubular piece 15 and compromising the temperature uniformity of the wafer holder.

In contrast to the conventional structure, the above-described wafer holder 1 of the present invention, having the structure as illustrated in FIG. 1, enables the atmosphere near the ceramic substrate 2 within the internally-plugged guide member 5 to be substantially the same as the atmosphere within the reaction chamber 6. This allows the heat escaping through the atmosphere within the tubular guide member 5 to be remarkably less than is conventional. Furthermore, since the guide member 5 is not joined to the ceramic substrate 2, the amount of heat conducted to the guide member 5 is also reduced. These effects make it possible to enhance the temperature uniformity of the wafer holder 1.

What is more, as noted above, the interior of the guide member 5 toward the ceramic substrate 2 is substantially the same as the atmosphere within the reaction chamber 6 at all times and does not allow the entry of ambient air. Therefore, the high-temperature portions of the electrode terminals and the leads 4 are shielded from the atmosphere, making their deterioration due to oxidation unlikely to occur and leading to extended lifetime. In addition, since the guide member 5 is not joined to the ceramic substrate 2, elevated costs due to reduction in throughput in jointing, as was conventionally the case.

When the lead 4 is housed in the tubular guide member 5 in this way, it is preferable that a portion of or the entirety of the lead 4 where it is disposed in the reaction chamber 6 be covered by the guide member 5. In particular, if the distances between a plurality of electrode terminals or leads 4 provided in the ceramic substrate 2 are short, sparks are liable to be generated due to their potential differences, but even in such cases, it is possible to suppress the generation of sparks by housing a large portion of or the entirety of the lead 4 that is within the reaction chamber 6 into an insulative guide member 5.

Figure 11:
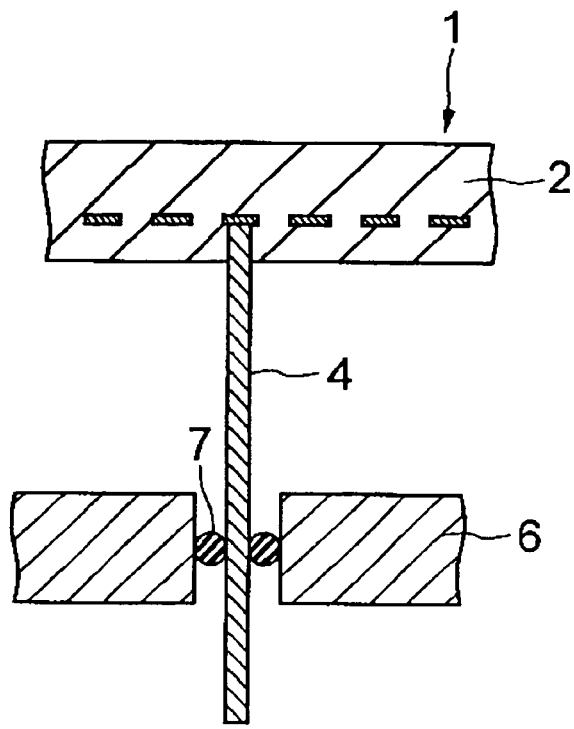
FIG. 11 is a schematic sectional view depicting yet another specific example of a mounting structure in the wafer holder of the present invention.

In the present invention, it is also possible to join one end of the guide member to the ceramic substrate, and such cases will be described later. In cases where the reaction chamber is an insulator such as alumina or cordierite, there is no possibility of current leakage to the reaction chamber side; therefore, for example as illustrated in FIG. 11, it is possible to hermetically seal the interval between the lead 4 and the reaction chamber 6 directly by means of an O-ring 7 or the like, without using an insulative guide member. In this case as well, it is possible to install a guide member in the reaction chamber to cover a portion of the lead as needed.

Next, with regard to insulative guide members that house leads, the plugging configuration at the other end of the guide member shown in FIG. 1 is described. First, it is necessary that the guide member 5 penetrate outside the reaction chamber 6 along where the lead 4 penetrates the reaction chamber 6. The reason for this is because the reaction chamber 6 is generally made of metal, current leakage can be prevented if the insulative guide member 5 covers at least the portion of the lead 4 where it penetrates the reaction chamber 6. Thus, the interval between the guide member 5 and the reaction chamber 6 is hermetically sealed by means of an O-ring 7 or the like.

At the same time, within the interior of the guide member 5 as well, the interval between the guide member 5 and the lead 4 is hermetically plugged. For this hermetic plugging within the guide member, it is preferable to use glass or a brazing material. Because the temperature of the lead grows high due to the heat transmitted from the ceramic substrate, plugging using glass, which has heat resistance, is preferable in terms of reliability. Nevertheless, plugging using an organic resin is also possible when, for example, the working temperature is low. With regard to the plugging location within the guide member, preferably it is plugged in a portion that is separated as far a distance as possible from the ceramic substrate, in order to minimize corrosion of the lead due to the atmosphere.

Figure 2:
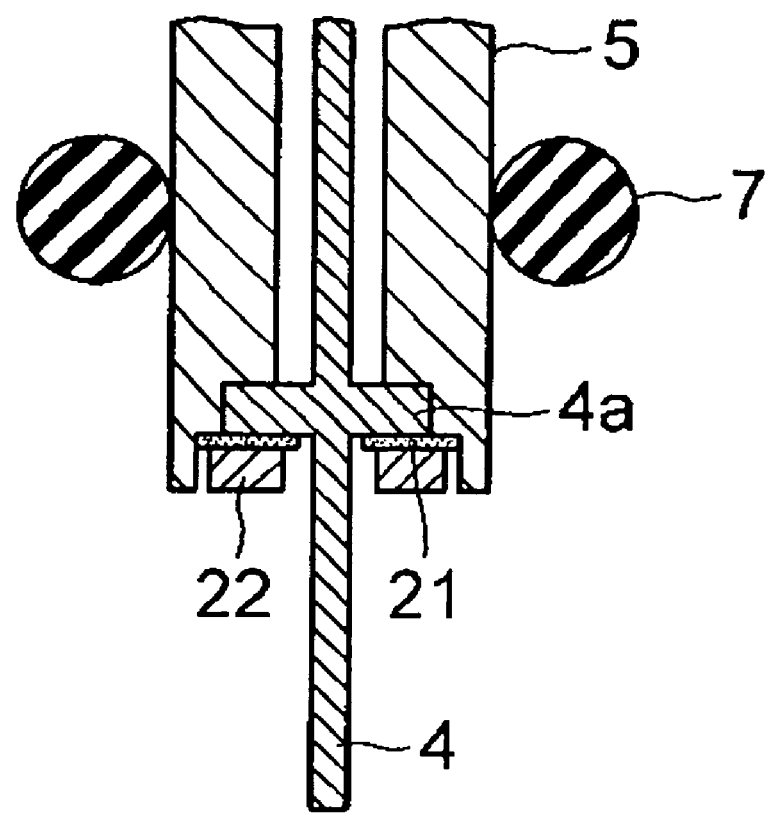
FIG. 2 is a schematic sectional view depicting a specific example of internal plugging of a guide member in the wafer holder of the present invention.
Figure 3:
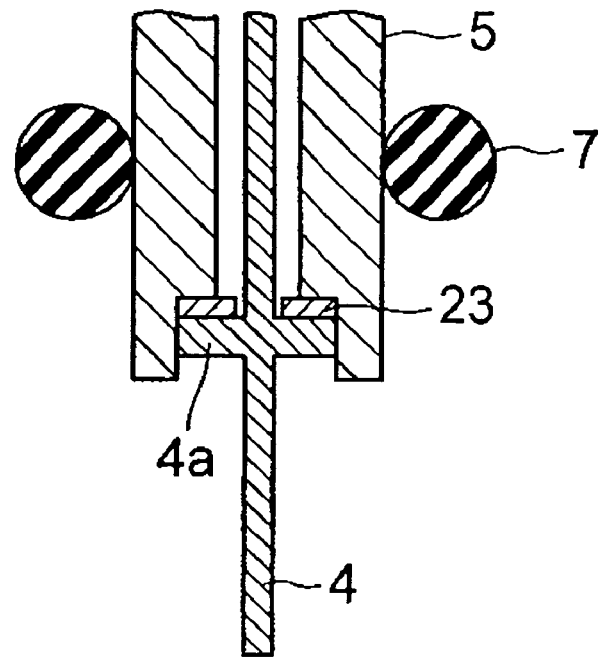
FIG. 3 is a schematic sectional view depicting another specific example of internal plugging of a guide member in the wafer holder of the present invention.

A specific hermetic plugging within the guide member is explained with reference to the drawings. A preferable method is, as illustrated in FIGS. 2 and 3, that the inner circumference of the distal end of the guide member 5 is machined to have a step and further, that the lead 4 is formed to have a protuberance 4a shaped so as to fit into the step in the guide member 5. The difference between the outer diameter of the protuberance 4a on the lead 4 and the inner diameter of the guide member 5 preferably is as small as possible; however, it is desirable that the difference be about 0.1 mm. A larger difference in the inner diameters reduces throughput in plugging and is therefore disadvantageous.

In the plugging method represented in FIG. 2, after inserting a lead 4 into this guide member 5, injecting glass 21 onto the stepped portion, and placing a ring-shaped member 22 thereon, a heating process is carried out at a predetermined temperature to soften the glass 21, so that the protuberance 4a from the lead, the guide member 5, and the ring-shaped member 22l are bonded together to form a hermetical plug. The glass 21 here may be powder, or may in advance be pre-baked or a molded piece. More reliable plugging is possible if load is applied to the glass 21 during this process.

In the plugging method represented in FIG. 3, the lead 4 is inserted into a guide member 5 that has been machined to have a step as in the case of FIG. 2, and the protuberance 4a from the lead 4 and the guide member 5 are joined together using a brazing material 23; thus, a hermetical plug is formed within the guide member 5.

Figure 4:
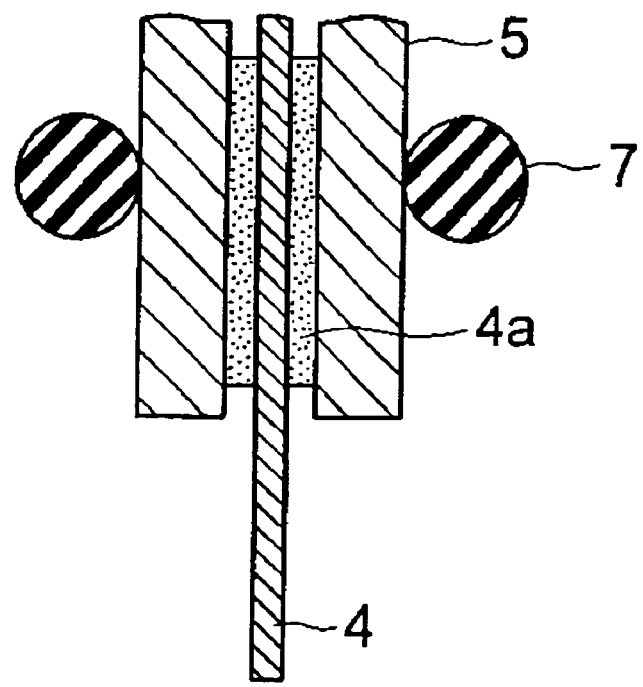
FIG. 4 is a schematic sectional view depicting yet another specific example of internal plugging of a guide member in the wafer holder of the present invention.

In addition, as illustrated in FIG. 4, it is also possible to form a hermetic plug by inserting a heat-resistant resin 2a into the lead member 5 and joining the lead 4 and the guide member 5 directly. In this case of joining by means of resin, it is desirable that the plugging be in a location distant from the ceramic substrate to prevent the temperature of the plugged portion from becoming elevated. Specific methods of plugging within the guide member are not limited to the foregoing methods, but any methods may be adopted insofar as hermetic plugging is possible.

Figure 5:
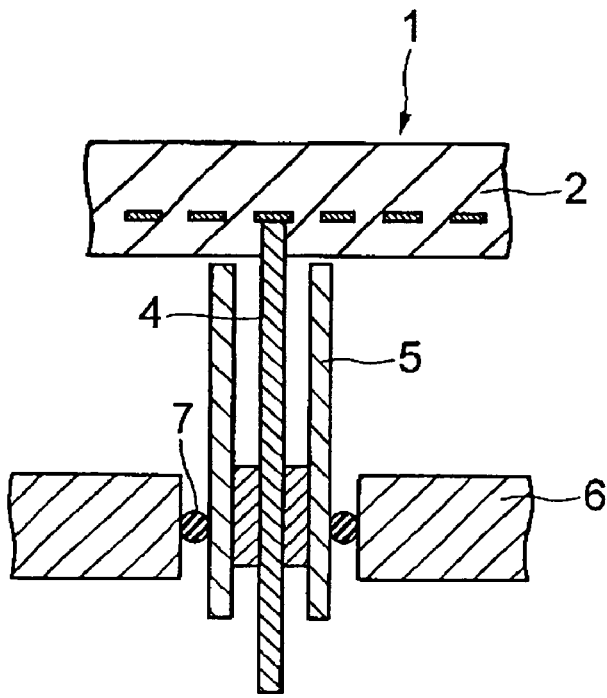
FIG. 5 is a schematic sectional view depicting a specific example of a mounting structure in the wafer holder of the present invention.

Next, a configuration for mounting the guide member to the ceramic substrate is explained. In a preferable mounting structure, as illustrated in FIG. 5 for example, a tubular guide member 5 in which a lead 4 is housed advantageously is not joined to the ceramic substrate 2 constituting the wafer holder 1, but is spaced apart from the surface on the side (back side) of the ceramic susceptor 2 opposite its wafer retaining surface. The reason is that within the interior of the internally-plugged guide member 5, the atmosphere toward the ceramic substrate 2 is thereby made substantially the same as the atmosphere within the reaction chamber 6.

In addition, in cases where the voltage is high tension, the guide member can be joined to the ceramic substrate in order to prevent sparking by ensuring inter-terminal insulation between the electrodes provided in the ceramic substrate. This makes it necessary, however, to implement a machining process on the guide member in order to introduce inside it the atmosphere within the reaction chamber. It will be appreciated that, in this case, almost the entirety or the major portion of the lead should be housed in the guide member, but it is also possible to house only that portion where the risk of sparking is greatest.

Figure 6:
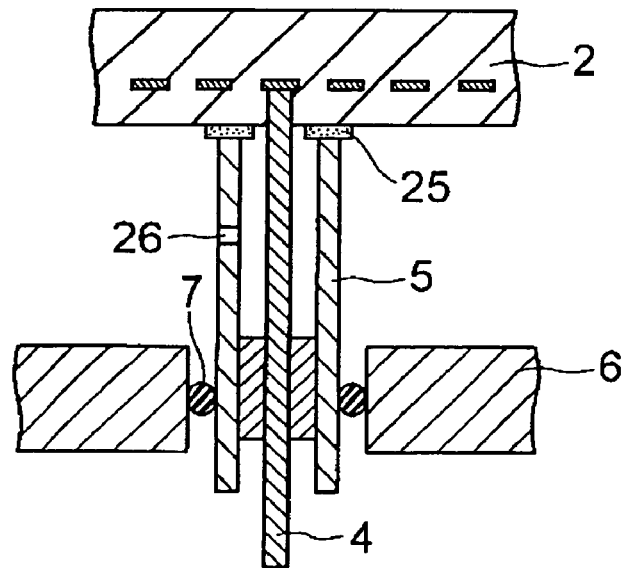
FIG. 6 is a schematic sectional view depicting another specific example of a mounting structure in the wafer holder of the present invention.
Figure 7:
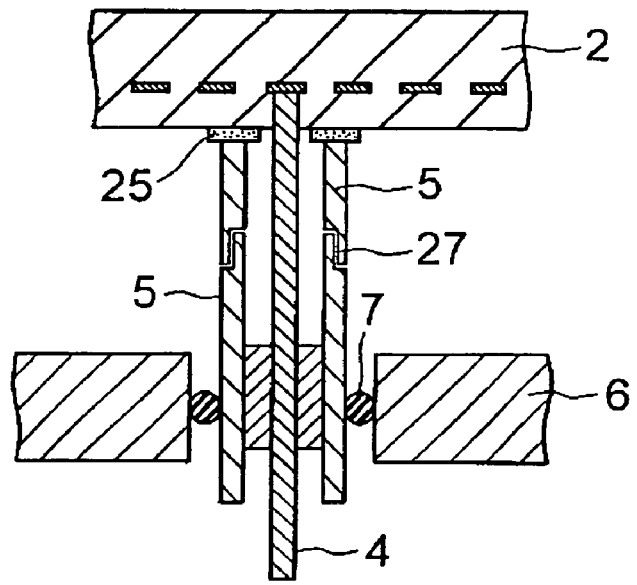
FIG. 7 is a schematic sectional view depicting a further specific example of a mounting structure in the wafer holder of the present invention.

For example, as shown in FIGS. 6 and 7, one end of the guide member 5 and the ceramic substrate 2 may be joined together with a joint part 25 utilizing glass, a brazing material or the like. In this case, the atmosphere within the guide member 5 is made substantially the same as the atmosphere within the reaction chamber 6 by means of a piercing hole 26 bored in the guide member 5 in the case of FIG. 6, or by means of an assemblage 2 in which the guide member 5 is pieced together with a plurality of parts.

Figure 8:
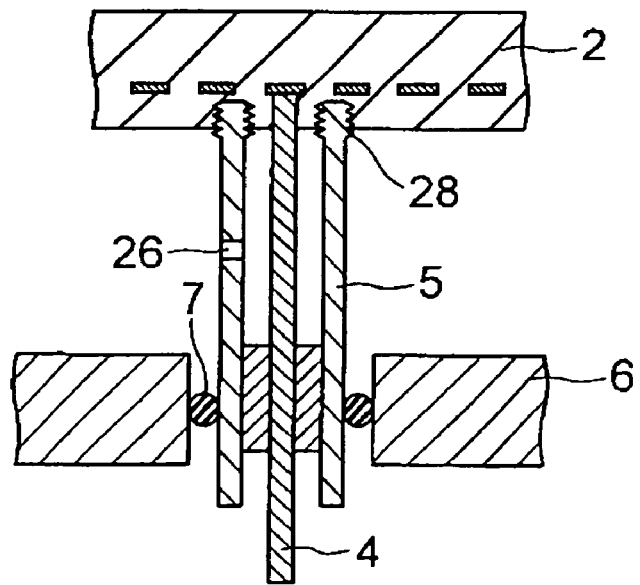
FIG. 8 is a schematic sectional view depicting yet another specific example of a mounting structure in the wafer holder of the present invention.

As shown in FIG. 8, one way the guide member and the ceramic substrate may be joined is to anchor them by means of a screw joint 28 in which a screw hole is formed in the back side of the ceramic substrate 2, and into the screw hole, an end of the guide member 5 that has been machined into a screw is screwed. In this case as well, it is desirable to form a piercing hole 26 in the guide member 5 in order to make the atmospheres same within the guide member 5 and the reaction chamber 6.

Figure 9:
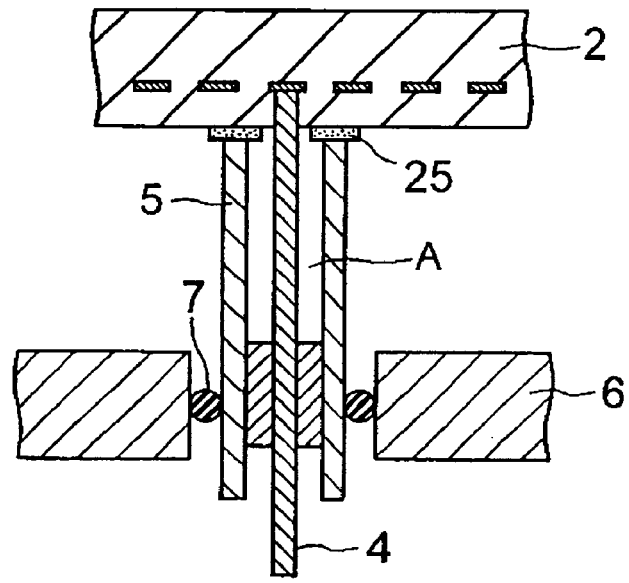
FIG. 9 is a schematic sectional view depicting still another specific example of a mounting structure in the wafer holder of the present invention.
Figure 10:
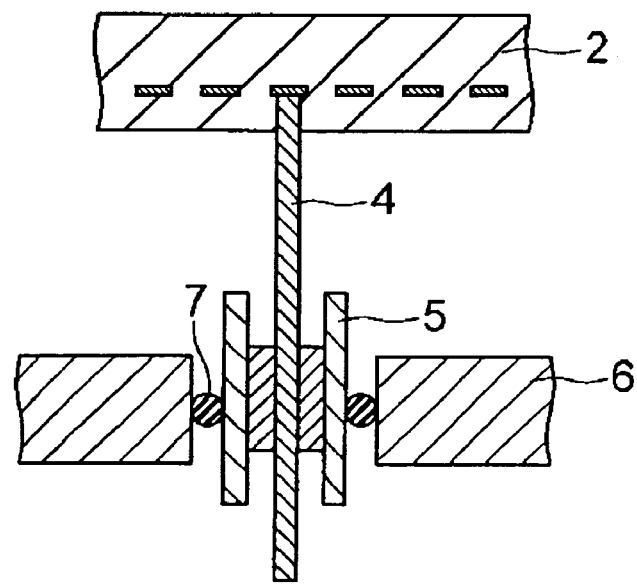
FIG. 10 is a schematic sectional view depicting a further specific example of a mounting structure in the wafer holder of the present invention.

In cases where the guide member is joined to the ceramic substrate, it is possible to prevent the escaping heat through the atmosphere within the guide member 5 and eliminate oxidation of the lead 4 without forming a piercing hole or the like in the guide member if within the hermetically-plugged guide member 5 the atmosphere A as indicated in FIG. 9 on the ceramic substrate 2 side of the plug is made a vacuum. Alternatively, in cases where sparking between the electrodes or leads provided in the ceramic substrate is unlikely to occur, such as where the working voltage is low, it is possible to arrange the guide member 5 only along the portion of the lead 4 where it penetrates the reaction chamber 6, as shown in FIG. 10.

While there are no particular restrictions as to the material for the guide member used in the present invention, inorganic ceramics, glass, and heat-resistant organic resins may be used. These materials may be selected according to how the wafer holder is employed. Preferable among ceramics are those whose chief component is whichever of mullite, alumina, silicon nitride, silicon carbide, or aluminum nitride.

When the guide member is installed either joined to or in contact with the ceramic substrate, it is desirable that the thermal conductivity of the guide member be lower than that of the ceramic substrate. This is because the heat generated by the resistive heating element diffuses into the ceramic substrate, and under the circumstances, if the thermal conductivity of the guide member is higher than that of the ceramic substrate, the heat generated by the resistive heating element will diffuse into the guide member before it uniformly diffuses through the ceramic substrate, lowering the temperature of the substrate area in contact with the guide members compared with the temperature of the rest of the substrate and consequently making the temperature distribution of the wafer retaining surface non-uniform.

In view of this, it is preferable that the thermal conductivity of the guide member be as low as possible. In addition, in cases where the guide member is joined to the ceramic substrate, it is preferable that its thermal expansion coefficient be near that of the ceramic substrate in order to reduce the stress incidents of at the joint. Taking these points into consideration, mullite is particularly preferable as the substance of the guide member for its having a very low thermal conductivity of about 1 W/mk, and also having a thermal expansion coefficient of 4 to $6 \times 10^{-6}$/K, which is closely akin to those of general ceramics.

Although it does not particularly matter what the substance of the ceramic susceptor is, preferable is one in which the principal component is whichever of alumina, silicon nitride, aluminum nitride, and silicon carbide. Because demands for uniformization of temperature distribution in wafer holders have grown intense in recent years, materials of high conductivity are preferable. Specifically, aluminum nitride and silicon carbide, which exhibit a thermal conductivity of higher than 100 W/mk, are preferable, with aluminum nitride being particularly preferable owing to the superiority of its corrosion resistance and insulating properties.

Meanwhile silicon nitride, because the strength of the ceramic itself at elevated temperatures is high compared with other ceramics, is ideal particularly for susceptors employed at high temperatures. Another advantage of the three substances, namely, silicon nitride, aluminum nitride, and silicon carbide, is their superior resistance to thermal shock, such that these ceramics are capable of rapid rise and fall in temperature. Alumina stands out meanwhile in that from a cost aspect it is superior compared with the other three ceramics. The choice as to which of these ceramics to use will as a matter of course depend on the application.

The wafer holder of the present invention, with incorporating a resistive heating element, a plasma-generating electrode, an electrostatic chuck electrode, an electron-beam electrode or the like according to the application, can be suitably installed in the reaction chambers of a variety of semiconductor manufacturing apparatuses. Most especially, the superior temperature uniformity of the wafer retaining surface means that the temperature distribution of the wafer is made exceedingly uniform during every sort of process, such as CVD and etching.

Additionally, in the wafer holder of the present invention, since the electrodes and the leads are generally exposed to the atmosphere within the reaction chamber, it is preferable that the gas used in the reaction chamber not be corrosive gases. For this reason, among semiconductor manufacturing apparatuses, use in an apparatus for low-k film baking, which does not have many restrictions on the materials that can be inserted into the reaction chamber, is especially suitable. Because the apparatus for low-k film baking does not use a corrosive gas, it is unnecessary to take corrosion of electrode terminals and leads, as well as of guide members, into consideration.

EMBODIMENTS

Embodiment 1

Slurries were prepared by adding predetermined amounts of sintering additive, binder, solvent, and so forth to ceramic powders of AlN, $Si_3N_4$, $Al_2O_3$, and SiC and blending the mixture with a ball mill. These slurries were granulated by spray drying, and the obtained granules were press-molded using dies of predetermined form. The molded objects thus produced were degreased and then sintered at respective predetermined temperatures, and ceramic substrates were obtained.

Using a technique such as screen printing, a resistive heating element circuit was formed on the ceramic substrates thus obtained, as well as RF electrodes, electrostatic-chuck electrodes, or electron-beam electrodes as needed. Each printed substrate was baked under predetermined conditions, and a ceramic plate was bonded over the substrate to cover the resistive heating element, RF electrodes, and electrostatic-chuck electrodes in order to protect them as needed. A wafer pocket for carrying a wafer was formed in the substrate by a machining operation, and electrode terminals and leads for connecting to the electric circuits were installed.

Meanwhile, guide members for housing electrode terminals and leads were fabricated from the base-material ceramics set forth in Tables I to IV. Prepared were simple tubular guide members, as well as guide members in which, to accord with the ceramic-substrate-end mounting structures A to G and Z shown in FIGS. 5 to 12, piercing holes were formed and in which a plurality of parts were pieced together. Here, all the guide members had an outer diameter of 10 mm and an inner diameter of 6 mm.

Next, these guide members were attached to a side of each ceramic substrate in accordance with Structures A to G and Z shown in FIGS. 5 to 12. Specifically, the guide members used were: tubular guide members that have not machined for Structures A, E, F, and Z; guide members having a 2 mm-diameter piercing holes for Structures B and D; and a guide member in which a plurality of parts are pieced together, for Structure C. To join the guide members and the ceramic substrates, screw-joining by means of screws was employed for Structure D, whereas glass was used for the others. However, Structure G did not use a guide member.

Thereafter, the interior of each guide member that housed a lead was hermetically plugged. Specifically, for the glass plug, plugging was in the manner shown in FIG. 2 using a glass ceramic; for the braze-material plug, plugging was in the manner shown in FIG. 3 using an active metal brazing material; and for the resin plug, plugging was in the manner shown in FIG. 4 using a heat-resistant epoxy resin. For Structure E, plugging was done in a vacuum so that the interior of the guide member would be a vacuum. Each of the internally-plugged guide members was penetrated at a predetermined location through a reaction chamber made of aluminum or alumina, having a predetermined configuration, and the interval between the reaction chamber and the guide member was hermetically plugged by means of an O-ring. In Structure G, which does not use a guide member, the interval between the reaction chamber and the lead was hermetically sealed directly by means of an O-ring.

With each sample wafer holder thus configured, electric current was passed through the resistive heating element to raise the temperature to the heater temperatures set forth in Tables I to IV with an inert gas being introduced into the reaction chamber, and the temperature uniformity was found by measuring the temperature of the wafer retaining surface with a wafer temperature gauge; the results obtained are set forth in the following Tables I to IV. Thereafter, each sample was cooled to room temperature, and the degrees of oxidation of the leads were evaluated. The results are shown in Tables I to IV, wherein those that exhibited almost no change in their surface color are indicated as "good," those with a slight color change into blue as "fair," and those with a color change into yellow as "poor." In all the samples, the lead material was a 4 mm diameter material of tungsten.

TABLE I

Ceramic substrate: AlN

| Sample | Guide member | Reaction chamber | Heater temp (° C.) | Internal plug | Mounting Struct. | Temp. uniformity (%) | Lead oxidation |
|---|---|---|---|---|---|---|---|
| 1 | Mullite | Al | 500 | Glass plug | Struct. A | ±0.3 | Good |
| 2 | Mullite | Al | 850 | Glass plug | Struct. A | ±0.3 | Good |
| 3 | Mullite | Al | 850 | Brazing material plug | Struct. A | ±0.3 | Good |
| 4 | Mullite | Al | 850 | Glass plug | Struct. B | ±0.4 | Good |
| 5 | Mullite | Al | 850 | Glass plug | Struct. C | ±0.4 | Good |
| 6 | Mullite | Al | 850 | Glass plug | Struct. D | ±0.4 | Good |
| 7 | Mullite | Al | 850 | Brazing material plug | Struct. E | ±0.4 | Good |
| 8 | Mullite | Al | 850 | Glass plug | Struct. F | ±0.3 | Good |
| 9 | Mullite | Al | 500 | Resin | Struct. F | ±0.3 | Good |
| 10 | None | $Al_2O_3$ | 500 | N/A | Struct. G | ±0.3 | Good |
| 11* | Mullite | Al | 500 | None | Struct. Z | ±0.6 | Fair |
| 12* | Mullite | Al | 850 | None | Struct. Z | ±0.6 | Poor |
| 13 | Mullite-$Al_2O_3$ | Al | 500 | Glass plug | Struct. A | ±0.3 | Good |
| 14 | Mullite-$Al_2O_3$ | Al | 850 | Glass plug | Struct. A | ±0.3 | Good |
| 15 | Mullite-$Al_2O_3$ | Al | 850 | Glass plug | Struct. C | ±0.4 | Good |
| 16* | Mullite-$Al_2O_3$ | Al | 850 | None | Struct. Z | ±0.6 | Poor |
| 17 | $Al_2O_3$ | Al | 500 | Glass plug | Struct. A | ±0.3 | Good |
| 18 | $Al_2O_3$ | Al | 850 | Glass plug | Struct. A | ±0.3 | Good |
| 19 | $Al_2O_3$ | Al | 850 | Glass plug | Struct. C | ±0.4 | Good |
| 20* | $Al_2O_3$ | Al | 850 | None | Struct. Z | ±0.6 | Poor |
| 21 | $Si_3N_4$ | Al | 500 | Glass plug | Struct. A | ±0.3 | Good |
| 22 | $Si_3N_4$ | Al | 850 | Glass plug | Struct. A | ±0.3 | Good |
| 23 | $Si_3N_4$ | Al | 850 | Glass plug | Struct. B | ±0.4 | Good |
| 24* | $Si_3N_4$ | Al | 850 | None | Struct. Z | ±0.6 | Poor |
| 25 | Sic | Al | 500 | Glass plug | Struct. A | ±0.3 | Good |
| 26 | Sic | Al | 850 | Glass plug | Struct. A | ±0.3 | Good |
| 27 | Sic | Al | 850 | Glass plug | Struct. B | ±0.5 | Good |
| 28* | Sic | Al | 850 | None | Struct. Z | ±0.7 | Poor |
| 29 | AlN | Al | 500 | Glass plug | Struct. A | ±0.4 | Good |
| 30 | AlN | Al | 850 | Glass plug | Struct. A | ±0.4 | Good |
| 31 | AlN | Al | 850 | Glass plug | Struct. C | ±0.5 | Good |
| 32* | AlN | Al | 850 | None | Struct. Z | ±0.7 | Poor |

(Note)
Samples marked with an asterisk (*) in the table are comparative examples.

TABLE II

Ceramic substrate: $Si_3N_4$

| Sample | Guide member | Reaction chamber | Heater temp. (° C.) | Internal plug | Mounting struct. | Temp. uniformity (%) | Lead oxidation |
|---|---|---|---|---|---|---|---|
| 1 | Mullite | Al | 500 | Glass | Struct. A | ±0.5 | Good |
| 2 | Mullite | Al | 850 | Glass plug | Struct. A | ±0.5 | Good |
| 3 | Mullite | Al | 1100 | Glass plug | Struct. A | ±0.5 | Good |
| 4 | Mullite | Al | 850 | Brazing material plug | Struct. A | ±0.5 | Good |
| 5 | Mullite | Al | 850 | Glass plug | Struct. B | ±0.6 | Good |
| 6 | Mullite | Al | 850 | Glass plug | Struct. C | ±0.6 | Good |
| 7 | Mullite | Al | 850 | Glass plug | Struct. D | ±0.6 | Good |
| 8 | Mullite | Al | 850 | Brazing material plug | Struct. E | ±0.6 | Good |
| 9 | Mullite | Al | 850 | Glass plug | Struct. F | ±0.5 | Good |
| 10 | Mullite | Al | 500 | Resin | Struct. F | ±0.5 | Good |
| 11 | None | $Al_2O_3$ | 500 | N/A | Struct. G | ±0.5 | Good |
| 12* | Mullite | Al | 500 | None | Struct. Z | ±1.3 | Fair |
| 13* | Mullite | Al | 850 | None | Struct. Z | ±1.3 | Poor |
| 14 | Mullite-$Al_2O_3$ | Al | 500 | Glass plug | Struct. A | ±0.5 | Good |
| 15 | Mullite-$Al_2O_3$ | Al | 850 | Glass plug | Struct. A | ±0.5 | Good |
| 16 | Mullite-$Al_2O_3$ | Al | 1100 | Glass plug | Struct. A | ±0.5 | Good |
| 17 | Mullite-$Al_2O_3$ | Al | 850 | Glass plug | Struct. C | ±0.6 | Good |

TABLE II-continued

Ceramic substrate: Si$_3$N$_4$

| Sample | Guide member | Reaction chamber | Heater temp. (° C.) | Internal plug | Mounting struct. | Temp. uniformity (%) | Lead oxidation |
|---|---|---|---|---|---|---|---|
| 18* | Mullite-Al$_2$O$_3$ | Al | 850 | None | Struct. Z | ±L.3 | Poor |
| 19 | Al$_2$O$_3$ | Al | 500 | Glass plug | Struct. A | ±0.5 | Good |
| 20 | Al$_2$O$_3$ | Al | 850 | Glass plug | Struct. A | ±0.5 | Good |
| 21 | Al$_2$O$_3$ | Al | 1100 | Glass plug | Struct. A | ±0.5 | Good |
| 22 | Al$_2$O$_3$ | Al | 850 | Glass plug | Struct. C | ±0.6 | Good |
| 23* | Al$_2$O$_3$ | Al | 850 | None | Struct. Z | ±1.3 | Poor |
| 24 | Si$_3$N$_4$ | Al | 500 | Glass plug | Struct. A | ±0.5 | Good |
| 25 | Si$_3$N$_4$ | Al | 850 | Glass plug | Struct. A | ±0.5 | Good |
| 26 | Si$_3$N$_4$ | Al | 850 | Glass plug | Struct. B | ±0.6 | Good |
| 27* | Si$_3$N$_4$ | Al | 850 | None | Struct. Z | ±1.3 | Poor |
| 28 | Sic | Al | 500 | Glass plug | Struct. A | ±0.5 | Good |
| 29 | Sic | Al | 850 | Glass plug | Struct. A | ±0.5 | Good |
| 30 | Sic | Al | 850 | Glass plug | Struct. B | ±0.5 | Good |
| 31* | Sic | Al | 850 | None | Struct. Z | ±1.5 | Poor |
| 32 | AlN | Al | 500 | Glass plug | Struct. A | ±0.6 | Good |
| 33 | AlN | Al | 850 | Glass plug | Struct. A | ±0.6 | Good |
| 34 | AlN | Al | 850 | Glass plug | Struct. C | ±0.5 | Good |
| 35* | AlN | Al | 850 | None | Struct. Z | ±1.5 | Poor |

(Note)
Samples marked with an asterisk (*) in the table are comparative examples.

TABLE III

Ceramic substrate: Al$_2$O$_3$

| Sample | Guide member | Reaction chamber | Heater temp. (° C.) | Internal plug | Mounting struct. | Temp. uniformity (%) | Lead oxidation |
|---|---|---|---|---|---|---|---|
| 1 | Mullite | Al | 500 | Glass plug seal | Struct. A | ±0.5 | Good |
| 2 | Mullite | Al | 850 | Glass plug | Struct. A | ±0.5 | Good |
| 3 | Mullite | Al | 850 | Brazing material plug | Struct. A | ±0.5 | Good |
| 4 | Mullite | Al | 850 | Glass plug | Struct. B | ±0.6 | Good |
| 5 | Mullite | Al | 850 | Glass plug | Struct. C | ±0.6 | Good |
| 6 | Mullite | Al | 850 | Glass plug | Struct. D | ±0.6 | Good |
| 7 | Mullite | Al | 850 | Brazing material plug | Struct. E | ±0.6 | Good |
| 8 | Mullite | Al | 850 | Glass plug | Struct. F | ±0.5 | Good |
| 9 | Mullite | Al | 500 | Resin plug | Struct. F | ±0.5 | Good |
| 10 | None | Al$_2$O$_3$ | 500 | N/A | Struct. G | ±0.5 | Good |
| 11* | Mullite | Al | 500 | None | Struct. Z | ±1.3 | Fair |
| 12* | Mullite | Al | 850 | None | Struct. Z | ±1.3 | Poor |
| 13 | Mullite-Al$_2$O$_3$ | Al | 500 | Glass plug | Struct. A | ±0.5 | Good |
| 14 | Mullite-Al$_2$O$_3$ | Al | 850 | Glass plug | Struct. A | ±0.5 | Good |
| 15 | Mullite-Al$_2$O$_3$ | Al | 850 | Glass plug | Struct. C | ±0.6 | Good |
| 16* | Mullite-Al$_2$O$_3$ | Al | 850 | None | Struct. Z | ±1.3 | Poor |
| 17 | Al$_2$O$_3$ | Al | 500 | Glass plug | Struct. A | ±0.5 | Good |
| 18 | Al$_2$O$_3$ | Al | 850 | Glass plug | Struct. A | ±0.5 | Good |
| 19 | Al$_2$O$_3$ | Al | 850 | Glass plug | Struct. C | ±0.6 | Good |
| 20* | Al$_2$O$_3$ | Al | 850 | None | Struct. Z | ±1.3 | Poor |
| 21 | Si$_3$N$_4$ | Al | 500 | Glass plug | Struct. A | ±0.5 | Good |
| 22 | Si$_3$N$_4$ | Al | 850 | Glass plug | Struct. A | ±0.5 | Good |
| 23 | Si$_3$N$_4$ | Al | 850 | Glass plug | Struct. B | ±0.6 | Good |
| 24* | Si$_3$N$_4$ | Al | 850 | None | Struct. Z | ±1.3 | Poor |
| 25 | SiC | Al | 500 | Glass plug | Struct. A | ±0.5 | Good |
| 26 | SiC | Al | 850 | Glass plug | Struct. A | ±0.5 | Good |
| 27 | SiC | Al | 850 | Glass plug | Struct. B | ±0.5 | Good |
| 28* | SiC | Al | 850 | None | Struct. Z | ±1.5 | Poor |
| 29 | AlN | Al | 500 | Glass plug | Struct. A | ±0.6 | Good |
| 30 | AlN | Al | 850 | Glass plug | Struct. A | ±0.6 | Good |
| 31 | AlN | Al | 850 | Glass plug | Struct. C | ±0.5 | Good |
| 32* | AlN | Al | 850 | None | Struct. Z | ±1.5 | Poor |

(Note)
Samples marked with an asterisk (*) in the table are comparative examples.

TABLE IV

Ceramic substrate: SiC

| Sample | Guide member | Reaction chamber | Heater temp. (° C.) | Internal plug | Mounting struct. | Temp. uniformity (%) | Lead oxidation |
|---|---|---|---|---|---|---|---|
| 1 | Mullite | Al | 500 | Glass plug | Struct. A | ±0.3 | Good |
| 2 | Mullite | Al | 850 | Glass plug | Struct. A | ±0.3 | Good |
| 3 | Mullite | Al | 850 | Brazing material plug | Struct. A | ±0.3 | Good |
| 4 | Mullite | Al | 850 | Glass plug | Struct. B | ±0.4 | Good |
| 5 | Mullite | Al | 850 | Glass plug | Struct. C | ±0.3 | Good |
| 6 | Mullite | Al | 850 | Glass plug | Struct. D | ±0.4 | Good |
| 7 | Mullite | Al | 850 | Brazing material plug | Struct. E | ±0.4 | Good |
| 8 | Mullite | Al | 850 | Glass plug | Struct. F | ±0.3 | Good |
| 9 | Mullite | Al | 500 | Resin plug | Struct. F | ±0.3 | Good |
| 10 | None | $Al_2O_3$ | 500 | N/A | Struct. G | ±0.3 | Good |
| 11* | Mullite | Al | 500 | None | Struct. Z | ±0.6 | Fair |
| 12* | Mullite | Al | 850 | None | Struct. Z | ±0.6 | Poor |
| 13 | Mullite-$Al_2O_3$ | Al | 500 | Glass plug | Struct. A | ±0.3 | Good |
| 14 | Mullite-$Al_2O_3$ | Al | 850 | Glass plug | Struct. A | ±0.3 | Good |
| 15 | Mullite-$Al_2O_3$ | Al | 850 | Glass plug | Struct. C | ±0.3 | Good |
| 16* | Mullite-$Al_2O_3$ | Al | 850 | None | Struct. Z | ±0.6 | Poor |
| 17 | $Al_2O_3$ | Al | 500 | Glass plug | Struct. A | ±0.3 | Good |
| 18 | $Al_2O_3$ | Al | 850 | Glass plug | Struct. A | ±0.3 | Good |
| 19 | $Al_2O_3$ | Al | 850 | Glass plug | Struct. C | ±0.3 | Good |
| 20* | $Al_2O_3$ | Al | 850 | None | Struct. Z | ±0.6 | Poor |
| 21 | $Si_3N_4$ | Al | 500 | Glass plug | Struct. A | ±0.3 | Good |
| 22 | $Si_3N_4$ | Al | 850 | Glass plug | Struct. A | ±0.3 | Good |
| 23 | $Si_3N_4$ | Al | 850 | Glass plug | Struct. B | ±0.4 | Good |
| 24* | $Si_3N_4$ | Al | 850 | None | Struct. Z | ±0.6 | Poor |
| 25 | SiC | Al | 500 | Glass plug | Struct. A | ±0.3 | Good |
| 26 | SiC | Al | 850 | Glass plug | Struct. A | ±0.3 | Good |
| 27 | SiC | Al | 850 | Glass plug | Struct. B | ±0.5 | Good |
| 28* | SiC | Al | 850 | None | Struct. Z | ±0.7 | Poor |
| 29 | AlN | Al | 500 | Glass plug | Struct. A | ±0.4 | Good |
| 30 | AlN | Al | 850 | Glass plug | Struct. A | ±0.4 | Good |
| 31 | AlN | Al | 850 | Glass plug | Struct. C | ±0.5 | Good |
| 32* | AlN | Al | 850 | None | Struct. Z | ±0.7 | Poor |

(Note)
Samples marked with an asterisk (*) in the table are comparative examples.

As will be understood from the results noted above, the wafer holders of the present invention, in which the guide members were hermetically plugged along the interior, achieved superior temperature uniformities in any of Structures A to G, compared with the wafer holder of Structure Z (FIG. 12), in which a conventional guide member is used. Moreover, the conventional wafer holder of Structure Z oxidation of the leads was evident, whereas with every sample of the present invention no oxidation of the leads was at all discernible.

Embodiment 2

Each sample wafer holder of the present invention fabricated according to Embodiment 1 was installed in a low-k film baking apparatus to process a wafer. The results were that all the wafer holders were capable of performing low-k film baking appropriately, and in particular, the wafer holders that exhibited a temperature uniformity of less than 0.5% yielded excellent film quality.

INDUSTRIAL APPLICABILITY

The present invention provides wafer holders in which local heat radiation during heating is kept under control and temperature uniformity of the wafer retaining surface is enhanced. Accordingly, using the wafer holders makes it possible to provide semiconductor manufacturing apparatuses that have high temperature uniformity, superior durability of electrode terminals and leads and are suitable for processing larger-diameter wafers.

The invention claimed is:

1. For use in a semiconductor manufacturing apparatus having a reaction chamber, a wafer holder comprising:
    a ceramic substrate internally including at least one electrical component selected from a resistive heating element, a plasma-generating electrode, an electrostatic chuck electrode, and an electron-beam electrode;
    a lead for connecting said at least one electrical component to an external electrode;
    a tubular guide member for housing said lead, wherein said guide member penetrates the reaction chamber at an interval therefrom, and an interior region of the tubular guide member is in fluid communication with an interior region of the reaction chamber;
    a seal hermetically sealing the interval between said lead and the reaction chamber; and
    a plug hermetically sealing the tubular guide member interior.

2. A wafer holder as set forth in claim 1, wherein said guide member and said ceramic substrate are not joined.

3. A wafer holder as set forth in claim 1, wherein said plug is either glass or a brazing material joining said lead to said guide member.

4. A wafer holder as set forth in claim 1, wherein said guide member covers either a portion of or the entirety of said lead where said lead is disposed within the reaction chamber.

5. A wafer holder as set forth in claim 1, wherein the principal component of said guide member is one selected from mullite, alumina, silicon nitride, silicon carbide or aluminum nitride.

6. A wafer holder as set forth in claim 1, wherein the principal component of said ceramic substrate is one selected from alumina, silicon nitride, aluminum nitride or silicon carbide.

7. A semiconductor manufacturing apparatus having a reaction chamber equipped with a wafer holder as set forth in claim 1.

8. A semiconductor manufacturing apparatus as set forth in claim 7, wherein the atmosphere within the reaction chamber is not a corrosive gas.

9. A semiconductor manufacturing apparatus as set forth in claim 8, the semiconductor manufacturing apparatus being for low-k film baking.

* * * * *

UNITED STATES PATENT AND TRADEMARK OFFICE
CERTIFICATE OF CORRECTION

| | | |
|---|---|---|
| PATENT NO. | : 7,268,321 B2 | Page 1 of 1 |
| APPLICATION NO. | : 10/498460 | |
| DATED | : September 11, 2007 | |
| INVENTOR(S) | : Masuhiro Natsuhara et al. | |

It is certified that error appears in the above-identified patent and that said Letters Patent is hereby corrected as shown below:

In claim 1, fourteenth line (column 14, line 60), "lead" should read --tubular guide member--.

Signed and Sealed this

Ninth Day of June, 2009

JOHN DOLL
*Acting Director of the United States Patent and Trademark Office*